(12) United States Patent
Chang et al.

(10) Patent No.: US 9,362,132 B2
(45) Date of Patent: Jun. 7, 2016

(54) SYSTEMS AND METHODS FOR A SEQUENTIAL SPACER SCHEME

(71) Applicant: Taiwan Semiconductor Manufacturing Company, Ltd., Hsin-Chu (TW)

(72) Inventors: Shih-Ming Chang, Hsinchu County (TW); Ming-Feng Shieh, Tainan County (TW); Ru-Gun Liu, Hsinchu County (TW); Tsai-Sheng Gau, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/262,279

(22) Filed: Apr. 25, 2014

(65) Prior Publication Data

US 2015/0311086 A1 Oct. 29, 2015

(51) Int. Cl.
*H01L 21/308* (2006.01)
*H01L 29/06* (2006.01)

(52) U.S. Cl.
CPC ........ *H01L 21/3086* (2013.01); *H01L 21/3088* (2013.01); *H01L 29/0657* (2013.01)

(58) Field of Classification Search
CPC ............ H01L 21/0337; H01L 21/3086; H01L 21/0338; H01L 21/3088; H01L 21/31144; H01L 21/32139; H01L 21/3081; H01L 21/0273; H01L 21/32; H01L 27/10844; H01L 21/00; G03F 1/70; G03F 7/11; G03F 7/0466

USPC .................................................. 438/696, 694
See application file for complete search history.

(56) References Cited

U.S. PATENT DOCUMENTS

| | | | |
|---|---|---|---|
| 2008/0141212 A1* | 6/2008 | Haffner .................. | B82Y 10/00 438/694 |
| 2010/0167548 A1* | 7/2010 | Kim ..................... | H01L 21/0338 438/694 |
| 2015/0318209 A1 | 11/2015 | Chang et al. | |

* cited by examiner

*Primary Examiner* — Caleen Sullivan
(74) *Attorney, Agent, or Firm* — Haynes and Boone, LLP

(57) ABSTRACT

The present disclosure describes methods for transferring a desired layout into a target layer. The method includes a step of forming a spacer, having a second width, around a first and a second desired layout feature pattern of the desired layout over a semiconductor substrate. The first desired layout feature pattern is formed using a first sub-layout and the second desired layout feature pattern is formed using a second sub-layout. The first and second desired layout feature patterns are separated by a first width. The method further includes forming a third desired layout feature pattern according to a third sub-layout. The third desired layout feature pattern is shaped in part by the spacer. The method further includes removing the spacer from around the first and second desired layout feature pattern and etching the target layer using the first, second, and third layout feature patterns as masking features.

20 Claims, 13 Drawing Sheets

SYSTEMS AND METHODS FOR A SEQUENTIAL SPACER SCHEME

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

BRIEF DESCRIPTION OF THE DRAWINGS

It is emphasized that, in accordance with the standard practice in the industry, various features are not drawn to scale. In fact, the dimensions of the various features may be arbitrarily increased or reduced for clarity of discussion.

Aspects of the figures in the present disclosure are best understood from the following detailed description as read in connection with the figures.

DETAILED DESCRIPTION

It is to be understood that the following disclosure provides many different embodiments, or examples, for implementing different features of the provided subject matter. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features are not in direct contact. Various features may be arbitrarily drawn in different scales for the sake of simplicity and clarity.

In semiconductor device fabrication, the pursuit of smaller feature size has required a number of technological changes, including changes in the fabrication processes uses to create features on a semiconductor wafer. More recently, to mitigate the difficulties presented by the increasingly small features, multiple lithography processes have been applied in patterning a single target layer. For example, a first photolithography step is used in a multiple lithography process to pattern some features according to a desired layout, while a second photolithography step is used to pattern other features according to the same desired layout to be produced in the target layer. Sub-layouts and corresponding submasks may be used to pattern a desired layout in stages. Some such processes may include double-lithography, double-etch (LELE), self-aligned double patterning (SADP) and similar processes. However, such multiple lithography processes have not been entirely satisfactory.

Figure 1:
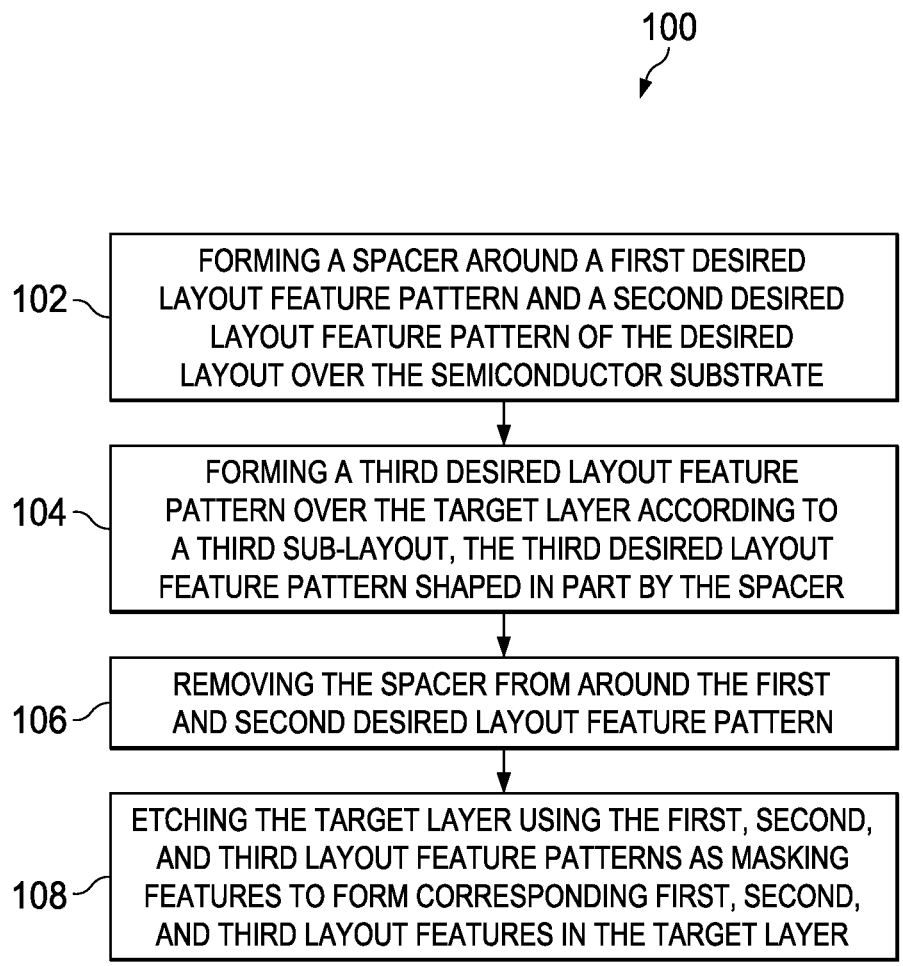
FIG. 1 is a flowchart of a method for transferring a desired layout into a target layer on a semiconductor substrate.

FIG. 1 illustrates a method 100 for transferring a desired layout into a target layer on a semiconductor substrate. As illustrated in FIG. 1, method 100 includes several enumerated steps. However, some embodiments of the method 100 include additional steps before, after, and/or in between the enumerated steps. As illustrated, method 100 begins in step 102 in which a spacer is formed around a first desired layout feature pattern and a second desired layout feature pattern of the desired layout over the semiconductor substrate. The first desired layout feature pattern is formed over the target layer using a first sub-layout and the second desired layout feature pattern is formed over the target layer using a second sub-layout. The first and second desired layout feature patterns are separated by a first distance or width. And the spacer has a second width. In step 104, a third desired layout feature pattern is formed over the target layer according to a third sub-layout. The third desired layout feature pattern is shaped in part by the spacer. In step 106, the spacer is removed from around the first and second desired layout feature pattern. And in step 108, the target layer is etched using the first, second, and third layout feature patterns as masking features to form corresponding first, second, and third layout features in the target layer.

Figure 2A:
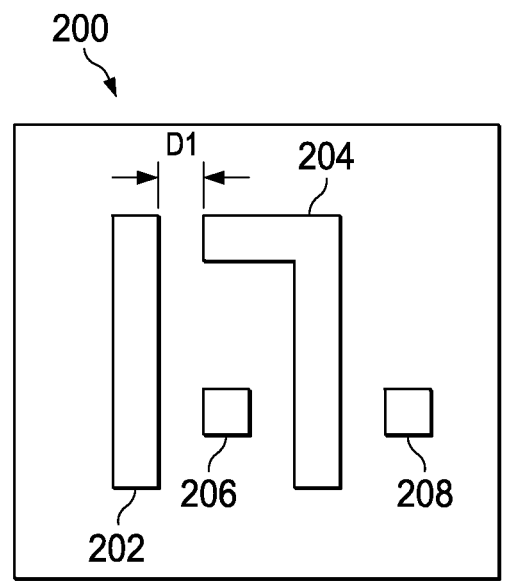
FIGS. 2A and 2B are fragmentary views of a desired layout and the desired layout as decomposed into three sub-layouts.

To more clearly describe at least one embodiment of the method 100 reference is made in discussing steps 102-108 to additional figures, including FIGS. 2A and 2B, 3A-C, 4A-C, 5A-C, 6A-C, 7A-C, 8A-C, 9A-C, 10A-C, 11A-C, and 12A-C. FIG. 2A illustrates a fragmentary view of a desired layout 200 that is to be realized in a target material layer in order to form components, like transistors, resistors, capacitors, and others, of a semiconductor device such as a processor or solid-state memory. Thus, while the desired layout 200 includes only four depicted features, embodiments of the desired layout 200 may include many thousands or millions of such features. As illustrated, the desired layout 200 includes a first desired layout feature 202, a second desired layout feature 204, a third desired layout feature 206, and a fourth desired layout feature 208. A minimum separation distance D1 is provided between at least the first and second desired layout features 202 and 204. For the sake of example, in a 10 nm technology node, D1 would be between about 5 nm and 15 nm. The desired layout 200 is provided as a computer-readable file, such as a GDSII file, or another such file as is known in the art.

Figure 2B:
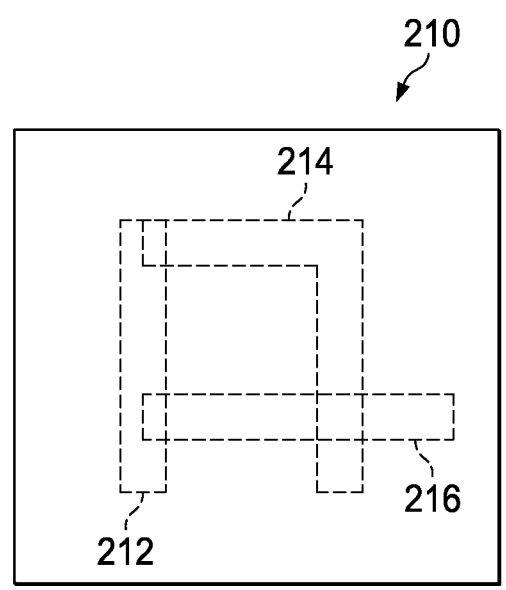

The desired layout 200 may thus be provided to a layout system, which in at least one embodiment is a computer, having one or more processors and memory, running programs to simulate and optimize a desired layout to increase the fidelity with which the desired layout is transferred to a target layer. Thus the layout system may provide for the modification of a desired layout, like the desired layout 200, by altering the geometries of the desired layout features 202, 204, 206, and 208 and/or by including assist features that are not intended to be transferred into a target layer, but that improve the transfer of the desired features. Thus, FIG. 2B illustrates the desired layout 200 after such optimization, including a decomposition process, that results in a decomposed desired layout 210. When the desired layout 200 is decomposed by the layout system, the features 202, 204, 206, and 208 may be assigned to two or more sub-layouts that belong to the decomposed desired layout 210. For example, features 202 and 204 may be assigned to different sub-layouts in addition to being modified to increase the fidelity of transference into the target layer. The sub-layouts are visually overlaid in FIG. 2B to more clearly illustrate the relationship of the decomposed desired layout 210 to the original desired layout 200. As depicted in FIG. 2B, the desired feature 202 is to be generated by a first sub-layout 212, while the second desired feature 204 is to be patterned by a second sub-layout 214. While the first desired feature 202 is not significantly altered by the layout system, an upper portion of the second sub-layout 204 is extended beyond the geometry of the second desired feature 204 order to ensure a proper transfer. As seen in FIG. 2A, layout features 202 and 204 are separated by a distance D1. In order to fabricate the desired separation distance reliably, a spacer process is used during the fabrication of the desired layout 200.

The layout system is aware of the spacer process in a fabrication process flow provided to the layout system. The layout system 100 uses the fabrication process flow to optimize the modification and decomposition of the desired layout 200 into the decomposed desired layout 210. Thus, in forming the sub-layouts 212 and 214, the layout system anticipates the use of a spacer to provide the desired separation distance. As seen in FIG. 2B, the decomposed desired layout 210 includes a third sub-layout 216. In conjunction with a spacer process, the sub-layout 216 is used to pattern the third layout feature 206 as well as the fourth feature 208. In some embodiments, the decomposed desired layout 210 may include additional sub-layouts.

Figure 3A:
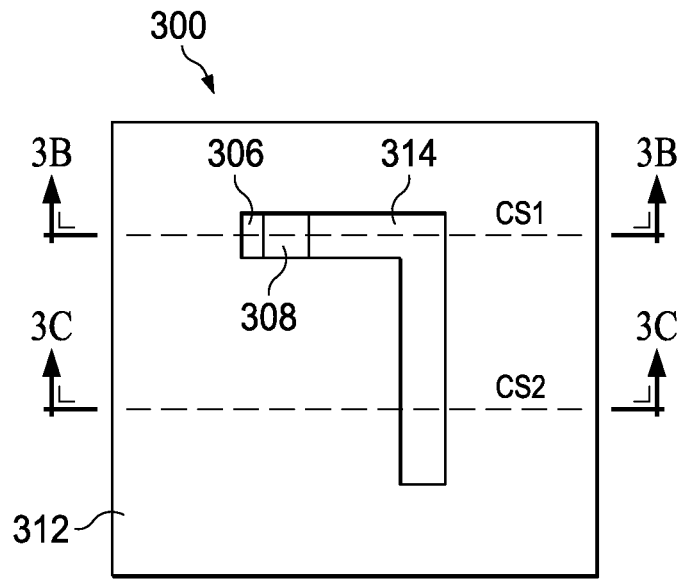
FIGS. 3A, 3B, and 3C are a fragmentary top view and two fragmentary cross-sectional diagrams of a semiconductor wafer during processing according to the flowchart of FIG. 1.
Figure 3B:
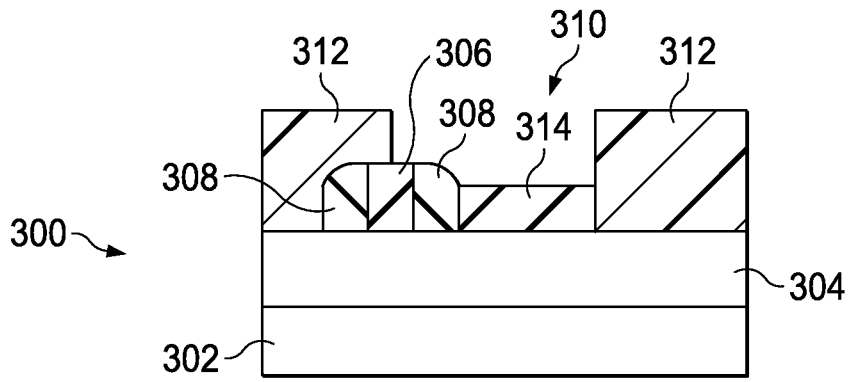
Figure 3C:
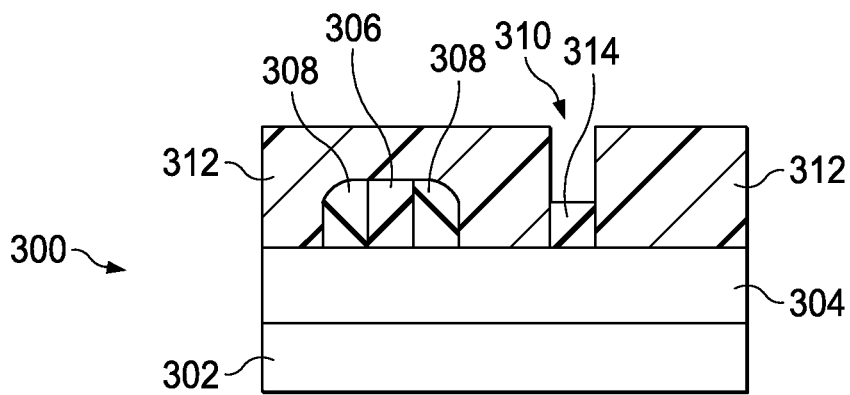

FIG. 3A illustrates a fragmentary top view of a wafer 300 that includes a substrate 302 with a plurality of material layers thereon. The substrate 302 is a silicon substrate, but may be another substrate material such as silicon oxide, silicon carbide, sapphire, or still other substrates. The substrate 302 is better seen in the cross-sectional views provided in FIGS. 3B and 3C. FIG. 3B illustrates the wafer 300 along a cross-sectional line CS1 of FIG. 3A. Similarly, FIG. 3C illustrates the wafer 300 along a cross-sectional line CS2 shown in FIG. 3A. Other cross-sectional views along lines CS1 and CS2 are illustrated in FIGS. 4B-C, 5B-C, 6B-C, 7B-C, 8B-C, 9B-C, 10B-C, 11B-C, and 12B-C and will be described in this disclosure.

As seen in FIGS. 3B and 3C, a target layer 304 is illustrated over the substrate 302. In some embodiments, the target layer 304 is in direct contact with the substrate 302. However, in other embodiments there may be many other layers, including patterned layers, between the target layer 304 and the substrate 302. In the illustrated embodiment, the target layer 304 is a conductive material layer. The target layer 304 may also be formed from copper, aluminum, gold, tungsten, or alloys thereof, or yet other materials.

Over the target layer 304, there is a first desired layout feature pattern 306. The first desired layout feature pattern 306 is formed using the sub-layout 212 as seen in FIG. 2B and discussed herein. Additionally, a spacer 308 is illustrated around or surrounding the feature pattern 306. The feature pattern 306 is formed from a patterned layer of an organic polymer. In some embodiments, the organic polymer of the feature pattern 306 is a silicon-containing polymer. And the spacer 308 is formed from silicon oxide, silicon nitride, titanium nitride, or other appropriate materials. Other materials may be used in different embodiments of the wafer 300 for the feature pattern 306 and the spacer 308. A trench 310 is formed in an intermediate layer 312, which is a photoresist layer as illustrated. A lower region of the trench is filled with a plug feature 314, which is disposed over the target layer 304. The plug feature 314 is an embodiment of the second desired layout feature pattern described in step 102 of method 100. The plug feature 314 is formed by a process that includes depositing a plug material layer over the wafer 300. The plug material layer is deposited or spun on in contact with the target layer 304, the feature pattern 306, and the spacer 308 as exposed by the trench 310, and over the intermediate layer 312. The plug material layer is etched back, removing material from over the intermediate layer 312, the feature pattern 306, and the spacer 308, but leaving a portion of the plug material layer that forms the plug feature 314.

Figure 4A:
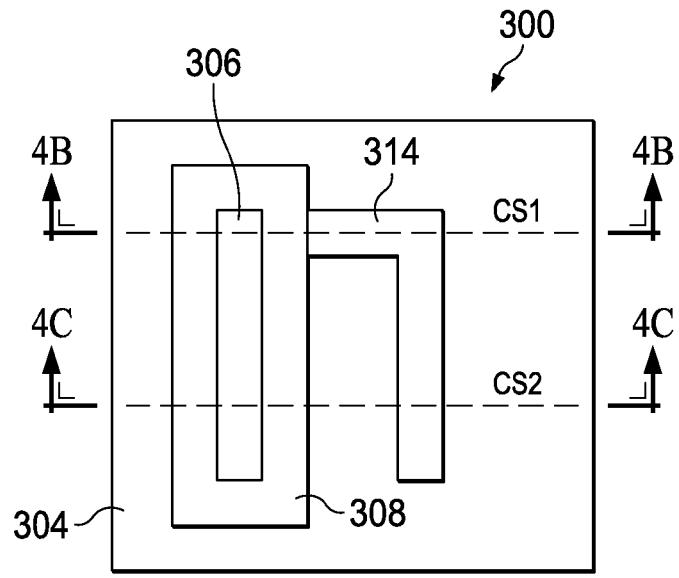
FIGS. 4A, 4B, and 4C are a fragmentary top view and two fragmentary cross-sectional diagrams of a semiconductor wafer during processing according to the flowchart of FIG. 1.
Figure 4B:
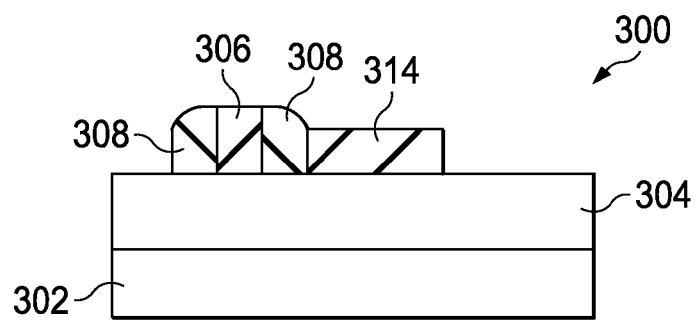
Figure 4C:
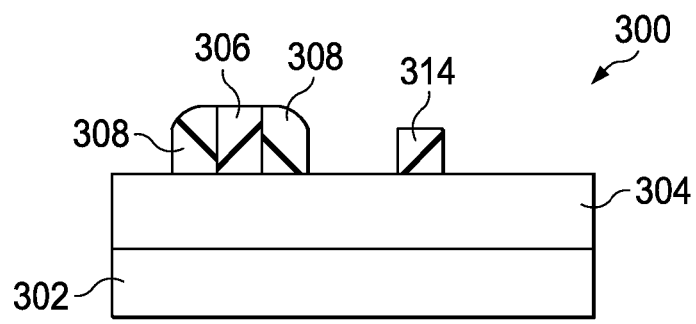

Referring now to FIGS. 4A, 4B, and 4C, the intermediate layer 312 is removed from the target layer 304, the feature pattern 306, the spacer 308. FIGS. 4B and 4C are cross-sectional illustrations taken along lines CS1 and CS2 of FIG. 4A. The plug feature 314, protrudes from the surface of the target layer 304 with its sidewalls exposed where not in contact with the spacer 308.

Figure 5A:
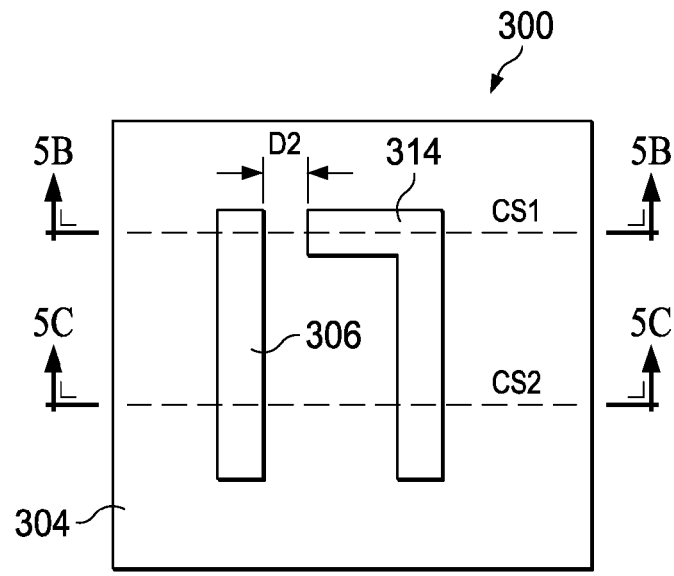
FIGS. 5A, 5B, and 5C are a fragmentary top view and two fragmentary cross-sectional diagrams of a semiconductor wafer during processing according to the flowchart of FIG. 1.
Figure 5B:
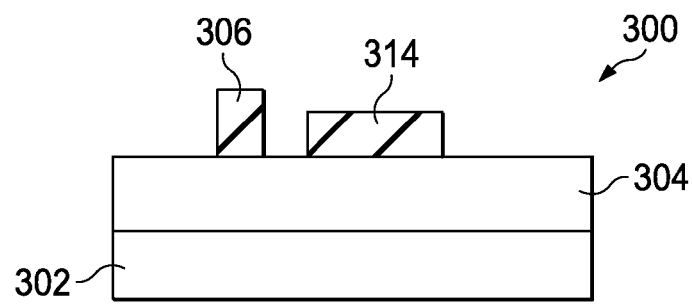
Figure 5C:
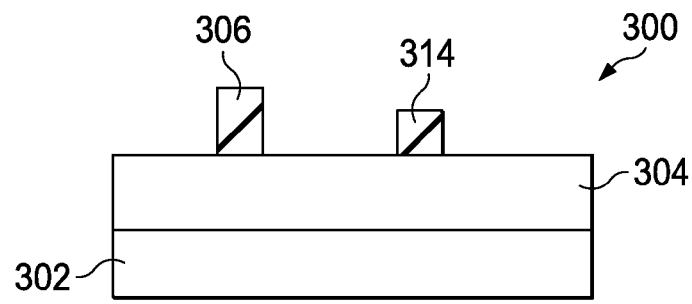

Referring now to FIGS. 5A, 5B, and 5C, the spacer 308 is removed from around the feature pattern 306 and from off of the target layer 304. FIGS. 5B and 5C are cross-sectional illustrations taken along lines CS1 and CS2 of FIG. 5A. As seen in top in FIG. 5A, the feature pattern 306 corresponds to the first sub-layout 212 and the first desired feature 202 of FIGS. 2B and 2A, respectively. The geometry of the plug feature 314 corresponds to the second desired layout feature 204 of FIG. 2, and is produced using the trench 310 of FIGS. 3A-C, which corresponds to the second sub-layout 214. As illustrated in FIGS. 5A and 5B, the feature pattern 306 and the plug feature 314 are separated by a distance D2. The distance D2 is the same as the distance D1, illustrated in the desired layout 200 of FIG. 2A. Also, the distance D2 is provided by, and is equal to, the width of the spacer 308. The width of the spacer 308 may be determined by the functions of the features to formed in the target layer 304 by using the feature pattern 306 and the plug feature 314.

Figure 6A:
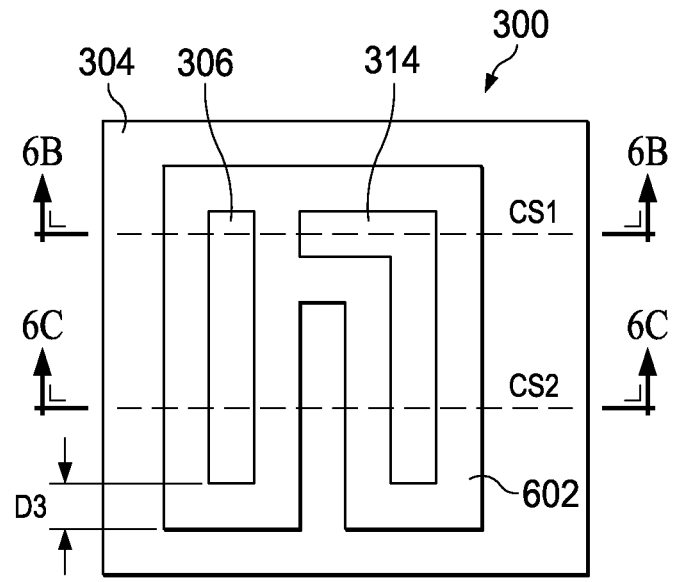
FIGS. 6A, 6B, and 6C are a fragmentary top view and two fragmentary cross-sectional diagrams of a semiconductor wafer during processing according to the flowchart of FIG. 1.
Figure 6B:
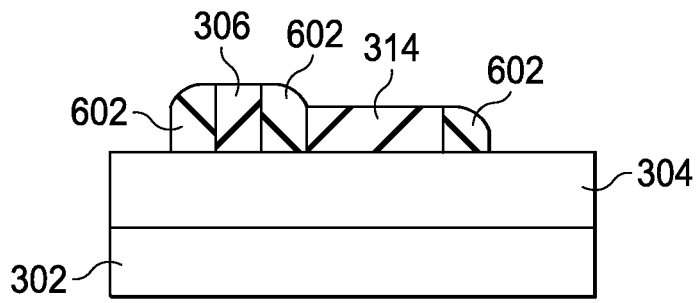
Figure 6C:
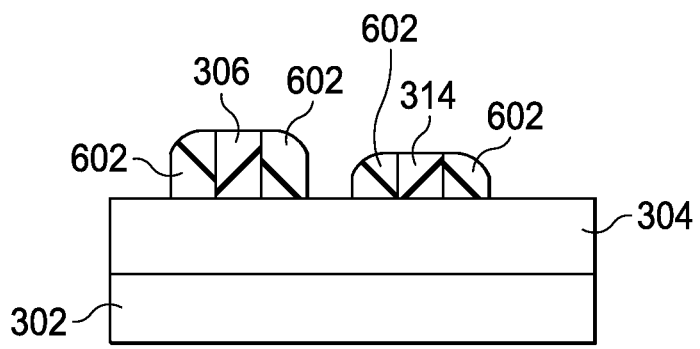

Referring now to FIGS. 6A, 6B, and 6C, a second spacer, spacer 602, is formed around both the feature pattern 306 and the plug feature 314, over the target layer 304. The formation of the spacer 602 is an embodiment of the step 102 of the method 100, illustrated in FIG. 1 and described herein. The spacer 308 as seen in FIGS. 4A-C had a first width D2, which provided the minimum separation distance between the feature pattern 306 and the plug feature 314. For the sake of example, in a 10 nm technology node, D2 would be between about 5 nm and 15 nm. As included in the method 100, the first and second desired layout feature patterns are separated by a first distance or width. The spacer 602 has a width D3, as illustrated in FIG. 6A. In some embodiments, the width D3 is less than the width of the spacer 308 (D2). In other embodiments, the width of the spacer 602 is greater than the width of the spacer 308. In such embodiments, separation distance between the feature pattern 306 and the plug feature 314 remains unchanged.

Figure 7A:
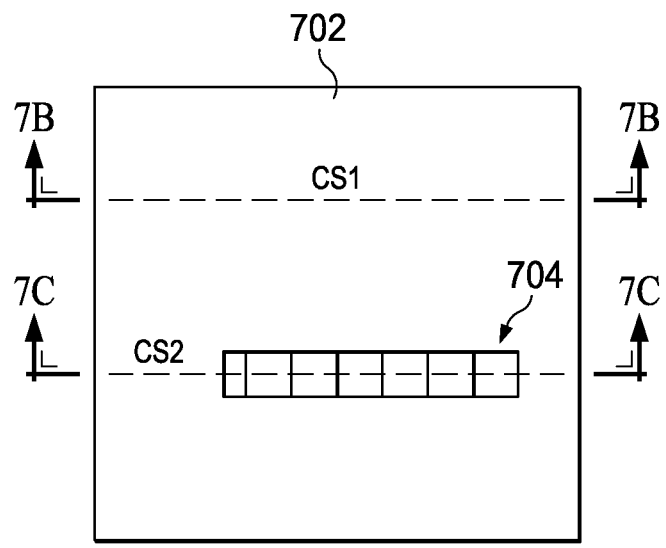
FIGS. 7A, 7B, and 7C are a fragmentary top view and two fragmentary cross-sectional diagrams of a semiconductor wafer during processing according to the flowchart of FIG. 1.
Figure 7B:
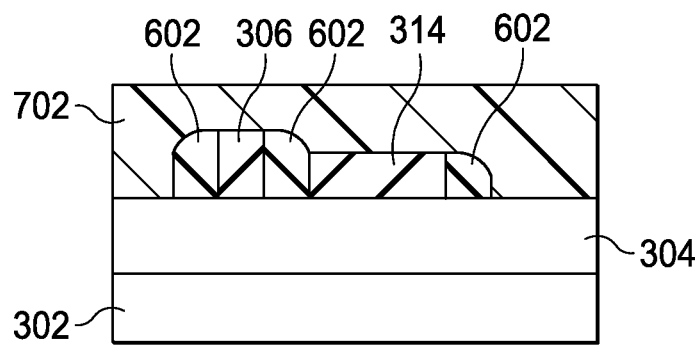
Figure 7C:
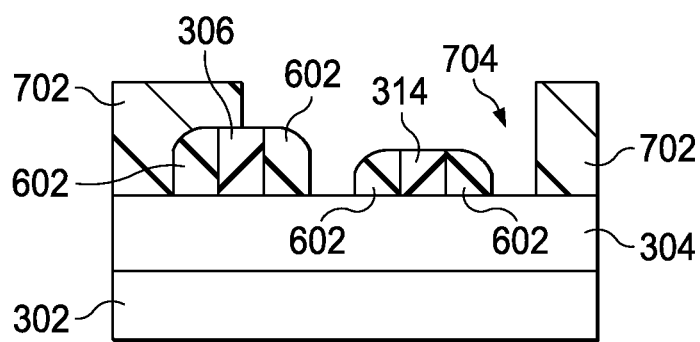

Referring now to FIGS. 7A, 7B, and 7C, the wafer 300 is shown therein having an additional intermediate layer 702 deposited over the features of the wafer 300 as seen in FIGS. 7A-C. The intermediate layer 702 may be a photoresist layer or another sacrificial layer. A trench 704 is formed in the intermediate layer 702 that exposes a portion of the pattern feature 306, the spacer 602, the target layer 304, and the plug feature 314. The trench 702 corresponds to the third sub-layout 216 as illustrated in FIG. 2B. The trench 702 may be formed by a development step in a photolithographic process, by electron beam direct writing, or by an etching process. The opening provided by the trench 704 is clearly depicted in FIG. 7C.

Figure 8A:
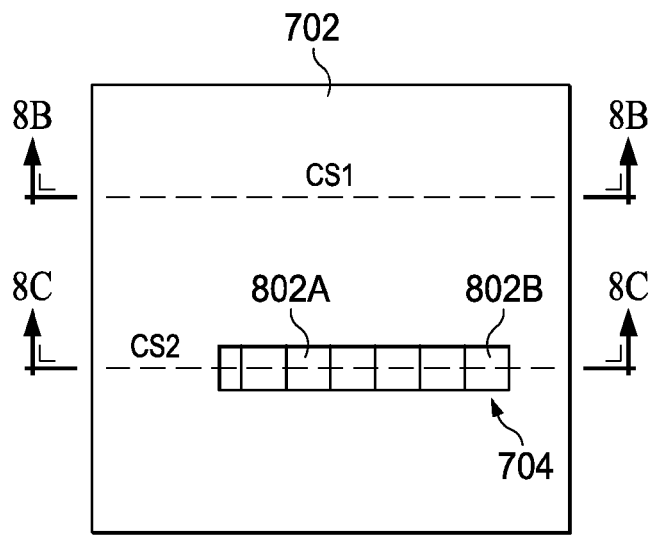
FIGS. 8A, 8B, and 8C are a fragmentary top view and two fragmentary cross-sectional diagrams of a semiconductor wafer during processing according to the flowchart of FIG. 1.
Figure 8B:
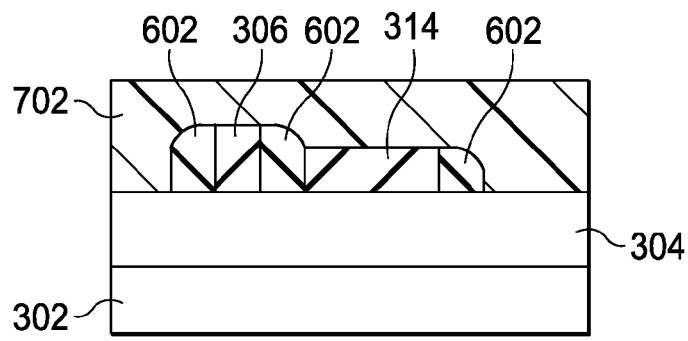
Figure 8C:
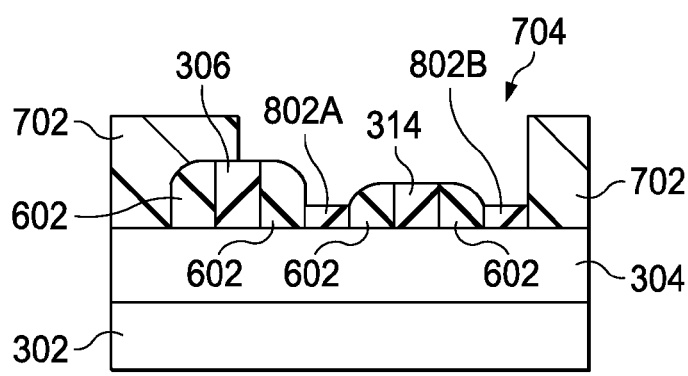

Referring now to FIGS. 8A, 8B, and 8C, an embodiment of the third desired layout feature pattern of step 104 of method 100 is shown therein. As seen in top view in FIG. 8A, plug features 802A and 802B are formed within the trench 704. The plug features 802A and 802B correspond to the third desired layout feature 206 and the fourth desired layout feature 208 as seen in the desired layout 200 of FIG. 2A. The plug features 802A and 802B are formed by depositing a plug material layer over the wafer 300, filling the trench 704. An etch back process removes the portions of the plug layer from over the intermediate layer 702 and from portions within the trench 704 that are above the feature pattern 306, the spacer 602, and the plug feature 314. In some embodiments, the plug feature 314 and the plug features 802A and 802B are formed from the same material. For example, the plug features 314, 802A, and 802B are formed from a silicon-containing polymer in some embodiments. However, in other embodiments, the plug feature 802A and 802B are formed from a different material than that of the plug feature 314.

Figure 9A:
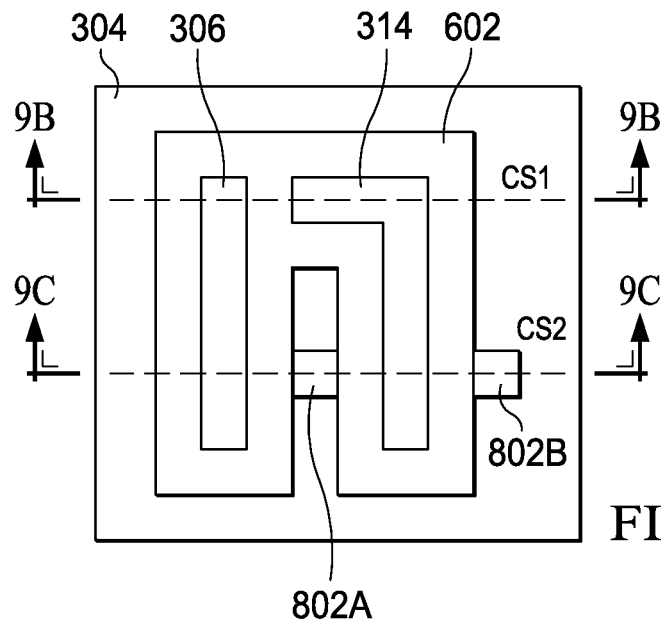
FIGS. 9A, 9B, and 9C are a fragmentary top view and two fragmentary cross-sectional diagrams of a semiconductor wafer during processing according to the flowchart of FIG. 1.
Figure 9B:
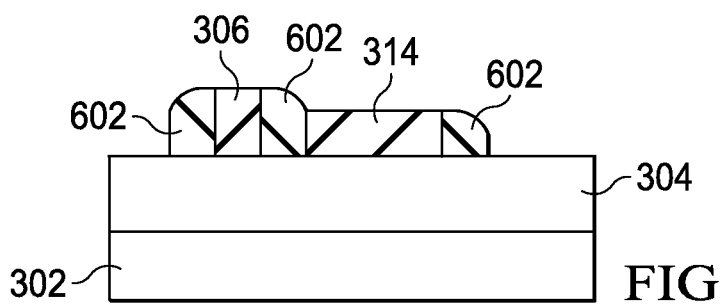
Figure 9C:
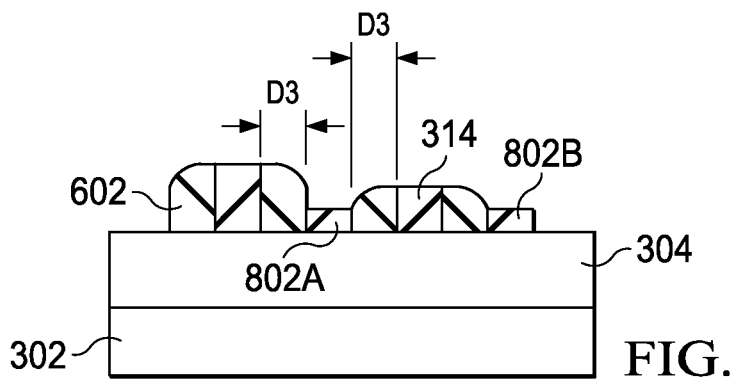

FIGS. 9A, 9B, and 9C illustrate the wafer 300 after the removal of the intermediate layer 702. As in seen in FIG. 9C, the plug feature 802A is separated from the feature pattern 306 and the plug feature 314, by a width of the spacer 602. Thus, the spacer 602 and the trench 704 are used to define the geometry of the plug features 802A and 802B.

Figure 10A:
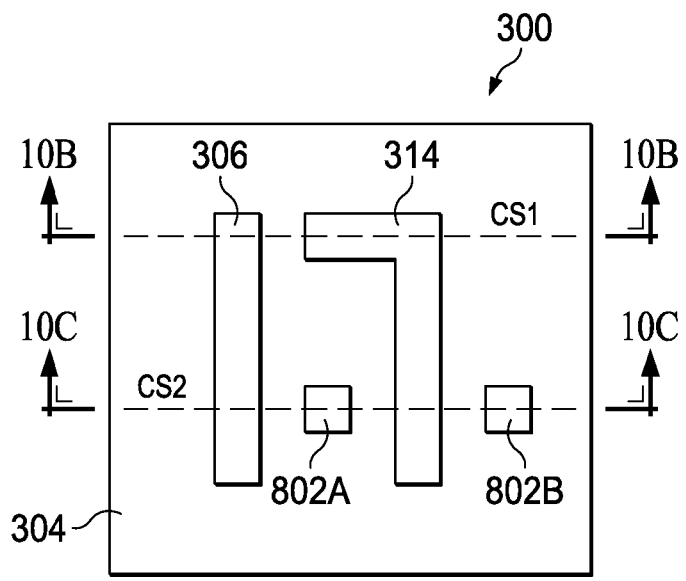
FIGS. 10A, 10B, and 10C are a fragmentary top view and two fragmentary cross-sectional diagrams of a semiconductor wafer during processing according to the flowchart of FIG. 1.
Figure 10B:
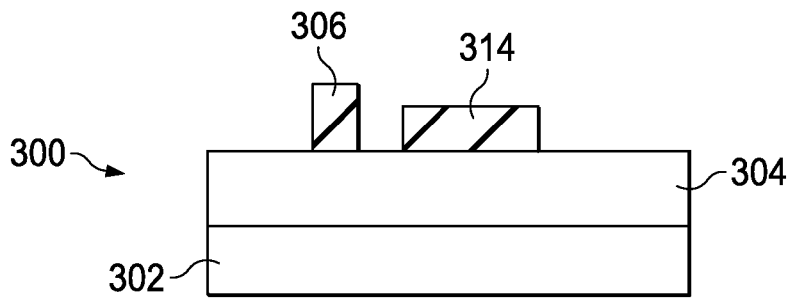
Figure 10C:
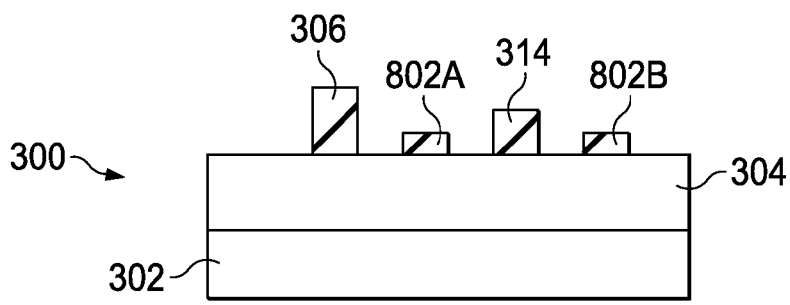

Referring now to FIGS. 10A, 10B, and 10C, FIG. 10A illustrates the wafer 300 in top view during processing, while FIGS. 10B and 10C illustrate the wafer 300 in cross-section along lines CS1 and CS2, respectively. As seen in FIGS. 10A-C, the spacer 602 is removed from around the pattern feature 306 and the plug feature 314 by an etching process. In some embodiments, the etching process is a wet etch, but in others a dry etch process is used. Thus, the result of step 106 of method 100 may be better understood by reference to FIGS. 10A-C.

Figure 11A:
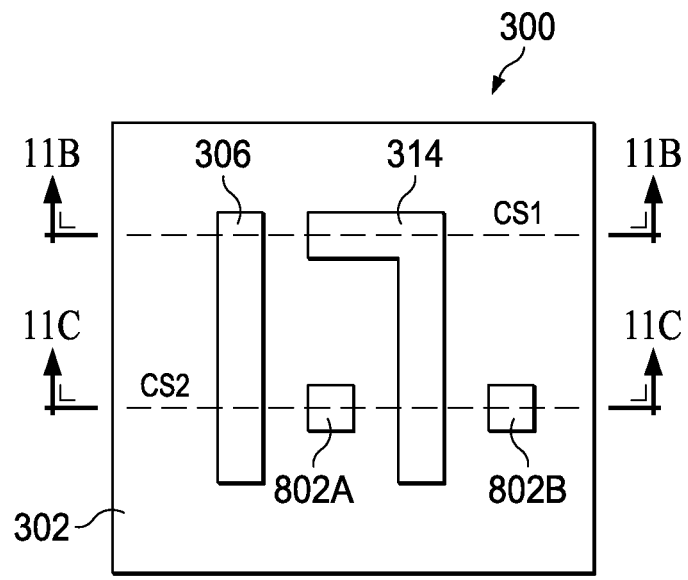
FIGS. 11A, 11B, and 11C are a fragmentary top view and two fragmentary cross-sectional diagrams of a semiconductor wafer during processing according to the flowchart of FIG. 1.
Figure 11B:
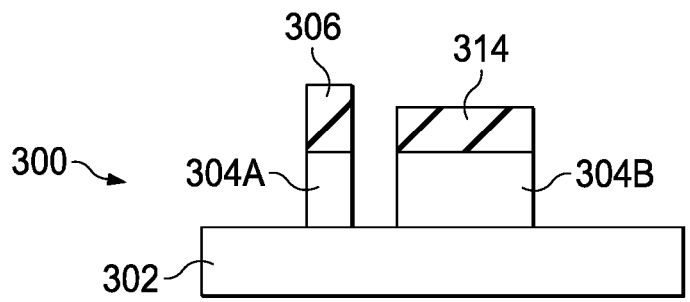
Figure 11C:
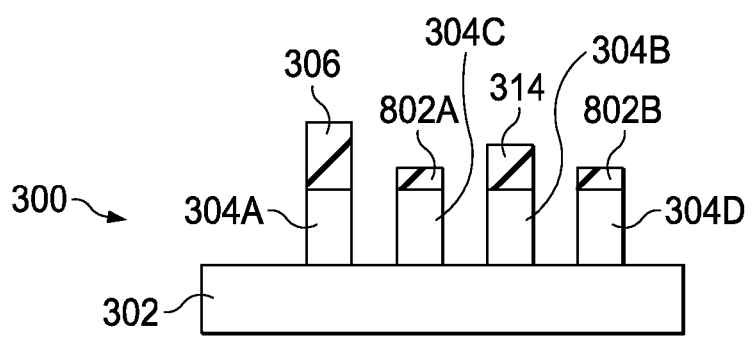

Referring now to FIGS. 11A, 11B, and 11C, the patterning of the target layer 304 is illustrated. As in step 108 of the method 100, an etch process is used to etch the target layer 304 to transfer the pattern feature 306, the plug feature 314 and the plug features 802A and 802B into the target layer. The feature pattern 306, the plug feature 314, and the plug features 802A and 802B are used as masking features during an etching process. In the top view of FIG. 11A, only the substrate 302, or the layer or layers below the target layer 304 in other embodiments, the pattern feature 306, the plug feature 314, and the plug features 802A and 802B are seen. In the cross-sectional views provided along lines CS1 and CS2, seen in FIGS. 11B and 11C, respectively, the remaining, patterned portions of the target layer 304 are illustrated. The patterned portions of the target layer 304 include a first target layer feature 304A, a second target layer feature 304B, and third and fourth target layer features 304C and 304D, respectively. Etch process is a dry etch process in the illustrated embodiment. However, in some other embodiments a wet etch is used.

Figure 12A:
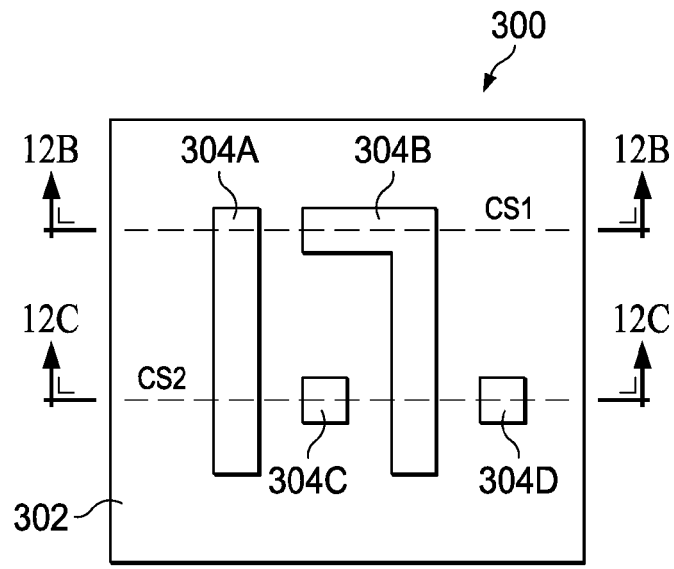
FIGS. 12A, 12B, and 12C are a fragmentary top view and two fragmentary cross-sectional diagrams of a semiconductor wafer during processing according to the flowchart of FIG. 1.
Figure 12B:
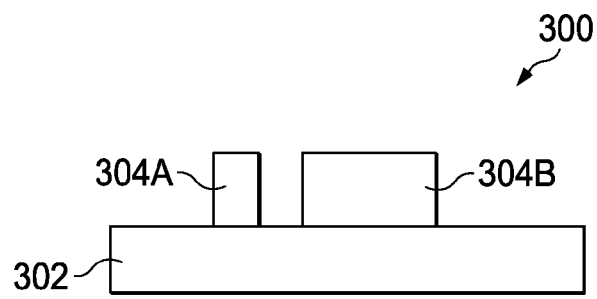
Figure 12C:
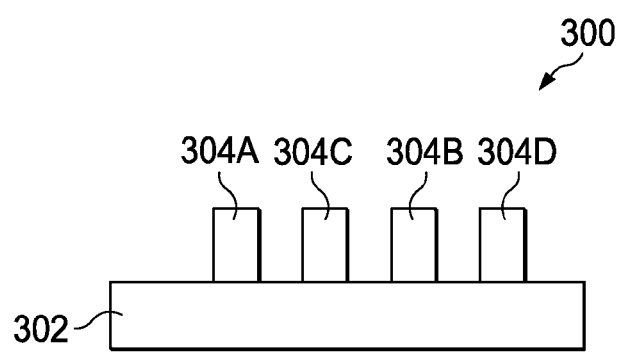

Referring now to FIGS. 12A, 12B, and 12C, the desired layout 200 of FIG. 2A is realized in the target layer 304 in features 304A-D. Thereafter, the pattern feature 306, the plug feature 314, and the plug features 802A and 802B are removed from off of the features 304A-D. In the illustrated embodiment, more than one etch step is used to remove the pattern features. A single etch process is used to remove the pattern feature 306, and a second etch process is used to remove the plug features 314, 802A, and 802B. In other embodiments, a single etch process is used to remove the pattern feature 306 and the plug features 314, 802A, and 802B.

Figure 13:
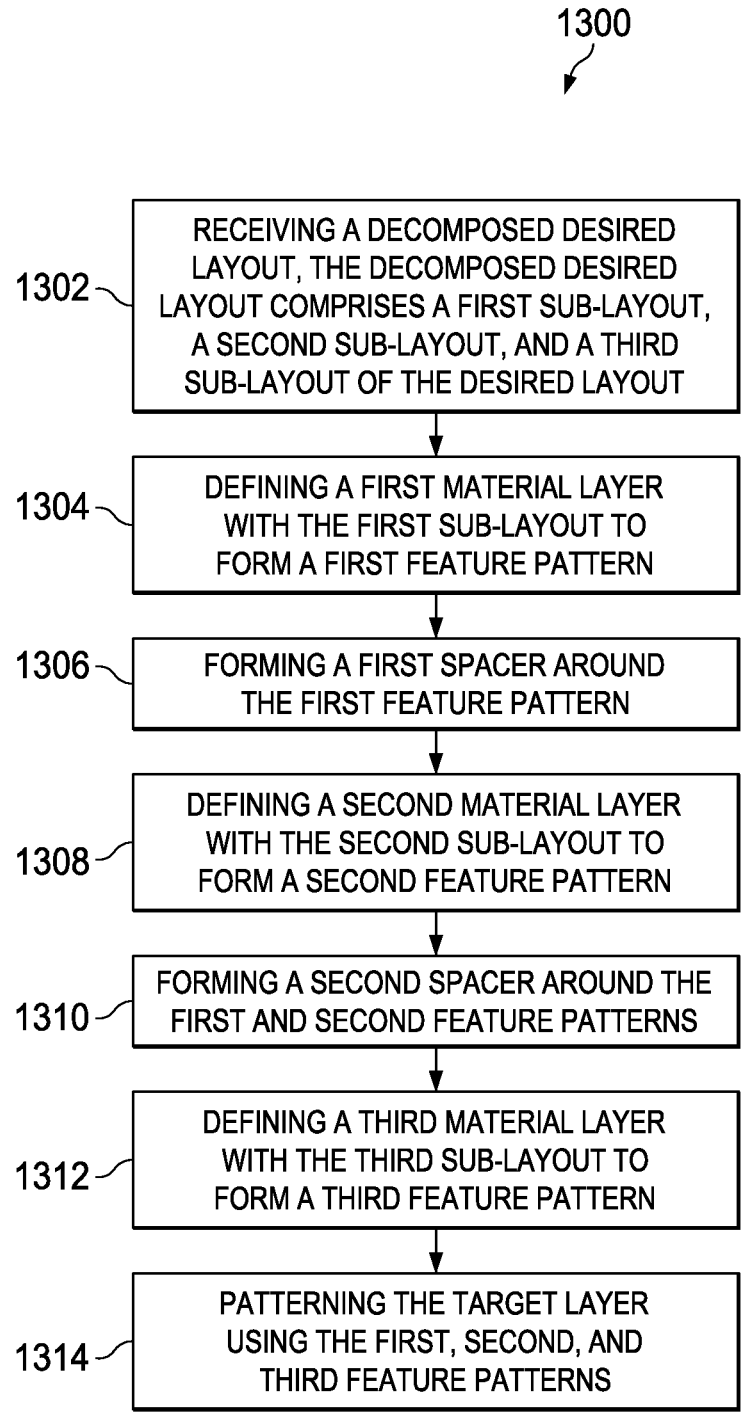
FIG. 13 is a flowchart of a method for transferring a desired layout into a target layer on a semiconductor substrate.

As seen in FIGS. 3A-C, 4A-C, 5A-C, 6A-C, 7A-C, 8A-C, 9A-C, 10A-C, 11A-C, and 12A-C, the sub-layouts 212, 214, and 216 of the decomposed desired layout 210 are used to pattern the desired layout 200 into the target layer 304. Minimum desired spacings are provided by a sequence of the spacers 308 and 602. In some embodiments, spacer 308 and 602 have the same width, while in others their widths are different. Additionally, some embodiments of the method 100 of FIG. 1, may include forming additional desired layout feature patterns and patterning them into the target layer 304. For example, when a fourth sub-layout is desired or required, a third spacer may be deposited around all of the features patterned earlier and a trench is formed and filled to provide the features of the fourth sub-layout. The patterns may be transferred by forming and filling trenches as described herein. Thus, more complicated desired layouts may be decomposed into more sub-layouts and patterned as described herein. Because the separation between features is provided Referring now to FIG. 13, a flowchart of a method 1300 for forming a desired layout in a target layer is illustrated. As illustrated, the method 1300 includes several enumerated steps. Embodiments of the method 1300 may include additional steps before, after, in between, and/or as part of the enumerated steps. As illustrated, method 1300 begins in step 1302 in which a decomposed desired layout is received. The decomposed layout may be similar to the decomposed desired layout 210 as illustrated in FIG. 2B. The decomposed desired layout 210 includes a first sub-layout, a second sub-layout, and a third sub-layout that can be combined to produce a desired layout. In step 1304, a first material layer is defined with the first sub-layout to form a first feature pattern, and in step 1306, a first spacer is formed around the first feature pattern.

In step 1308, a second a second material layer is defined with the second sub-layout to form a second feature pattern. The first and second feature patterns being separated by at least a width of the first spacer. This may be seen in FIGS. 3A-C, in which a trench 310 is patterned into an intermediate layer 312. The trench 310 is filled to form a second feature pattern, shown in FIGS. 3A-C as the plug feature 314. After the trench 310 is filled, the intermediate layer 312 may be removed as seen in FIGS. 4A-C, thereby exposing the first spacer. In step 1309, the first spacer 308 may then be removed from around the feature pattern 306 by an etch processes, such as a wet etch process, as seen in FIGS. 5A-C. In some embodiments, the first spacer 308 may be thinned by etching rather than be removed entirely.

In step 1310, a second spacer is formed around the first and second feature patterns. An embodiment of the second spacer is illustrated in FIGS. 6A-C, which show the spacer 602, which surrounds both the feature pattern 306 and the plug feature 314. In step 1312, a third material layer is defined with the third sub-layout to form a third feature pattern that is separated from the first and second feature patterns by at a width of the second spacer. FIGS. 7A-C and 8A-C illustrate an embodiment of the step 1312. As illustrated, an intermediate layer 702 is deposited and an opening or trench 704 is formed therein. Two plug features 802A and 802B are formed within the trench 704 on the exposed portions of the target layer 304 therein. In step 1313, the intermediate layer 702 is removed and the second spacer 602 is removed as depicted in FIGS. 9A-C. In some embodiments, the second spacer 602 is not entirely removed, but is thinned by an etch process instead.

In step 1314, the target layer is patterned using the first, second, and third feature patterns. Referring to FIGS. 10A-C and 11A-C, the feature pattern 306, the plug feature 314, and the plug features 802A and 802B are used as masking features in an etch process to remove the exposed portions of the target layer 304, resulting in the desired layout as seen in FIGS. 12A-C.

The methods and structures described above may facilitate the reproduction of complex patterns of increasingly small features by facilitating the decomposition of a desired layout into realizable sub-layouts. Minimum spacing is reliably maintained between all of the features formed from each of the sub-layouts by using a sequence of spacers. In one embodiment, this is achieved by using and removing spacers to form a feature layout with which to pattern another layer.

In one exemplary aspect, the present disclosure describes a method for transferring a desired layout into a target layer on a semiconductor substrate. The method includes a step of forming a spacer around a first desired layout feature pattern and a second desired layout feature pattern of the desired layout over the semiconductor substrate. The first desired layout feature pattern is formed over the target layer using a first sub-layout and the second desired layout feature pattern is formed over the target layer using a second sub-layout. The first and second desired layout feature patterns are separated by a first width and the spacer has a second width. The method further includes a step of forming a third desired layout feature pattern over the target layer according to a third sub-layout. The third desired layout feature pattern is shaped in part by the spacer. The method further includes steps of removing the spacer from around the first and second desired layout feature pattern and of etching the target layer using the first, second, and third layout feature patterns as masking features to form corresponding first, second, and third layout features in the target layer.

In another exemplary aspect, another method for transferring a desired layout into a target layer on a semiconductor substrate is disclosed herein. The method includes steps of receiving a decomposed desired layout that has a first sub-layout, a second sub-layout, and a third sub-layout of the desired layout, defining a first material layer with the first sub-layout to form a first feature pattern, and forming a first spacer around the first feature pattern. The method further includes steps of defining a second material layer with the second sub-layout to form a second feature pattern separated from the first feature pattern by at least a width of the first spacer, forming a second spacer around the first and second feature patterns, and defining a third material layer with the third sub-layout to form a third feature pattern. The third feature pattern is separated from the first and second feature patterns by at a width of the second spacer. Additionally, the method includes a step of patterning the target layer using the first, second, and third feature patterns.

In an additional exemplary aspect, a semiconductor wafer is disclosed herein. The semiconductor wafer includes a top surface and a bottom surface, a target material layer over the substrate, and a desired layout formed over and in contact with the target material layer. The desired layout includes a first desired layout feature pattern, a second desired layout feature pattern, and a third desired layout feature pattern, with each feature pattern being formed from a different sub-layout of the desired layout. The third desired layout feature pattern is separated from the first and second desired layout feature patterns by a minimum spacing.

The embodiments presented by the top view and cross-sectional view figures described above are not exhaustive. Some processes discuss in any given embodiment may be performed in different orders or have additional processes between the steps. For example, one etch process may be used to remove multiple layers even where more than one is discussed. Thus, the examples provided above are exemplary. They are not intended to be limiting. One skilled in the art may readily devise other systems and methods consistent with the disclosed embodiments. These other systems and methods are intended to be within the scope of this disclosure. As such, the disclosure is limited only by the following claims.

What is claimed is:

1. A method for transferring a desired layout into a target layer on a semiconductor substrate, the method comprising:
   forming a spacer around a first desired layout feature pattern and a second desired layout feature pattern of the desired layout over the semiconductor substrate, the first desired layout feature pattern formed over the target layer using a first sub-layout and the second desired layout feature pattern formed over the target layer using a second sub-layout, wherein the first and second desired layout feature patterns are separated by a first width and the spacer has a second width;
   forming the second desired layout feature pattern by etching an intermediate layer using the second sub-layout to create a trench within the intermediate layer, thereby exposing a portion of the target layer and the spacer;
   forming a plug within at least a portion of the trench;
   forming a third desired layout feature pattern over the target layer according to a third sub-layout, the third desired layout feature pattern shaped in part by the spacer;
   etching the spacer from around the first and second desired layout feature pattern; and
   after etching the spacer, etching the target layer using the first, second, and third layout feature patterns as masking features to form corresponding first, second, and third layout features in the target layer.

2. The method of claim 1, further comprising:
   receiving a desired layout in a computer-readable format; and
   decomposing the desired layout into a plurality of sub-layouts that comprises the first sub-layout, the second sub-layout, and the third sub-layout.

3. The method of claim 1, further comprising:
   forming the first desired layout feature pattern by etching a first desired layout feature pattern material layer using the first sub-layout; and forming an initial spacer around the first desired layout feature pattern, the initial spacer having the first width.

4. The method of claim 3, further comprising:
removing the intermediate layer; and
etching the initial spacer.

5. The method of claim 1, wherein the first sub-layout and the second sub-layout overlap and the third sub-layout overlaps at least one of the first sub-layout and the second sub-layout.

6. The method of claim 1, wherein the forming of the plug includes a spin-on process to deposit the plug within the trench.

7. The method of claim 1, wherein the intermediate layer includes a photoresist material.

8. A method for transferring a desired layout into a target layer on a semiconductor substrate, the method comprising:
forming a spacer around a first desired layout feature pattern and a second desired layout feature pattern of the desired layout over the semiconductor substrate, the first desired layout feature pattern formed over the target layer using a first sub-layout and the second desired layout feature pattern formed over the target layer using a second sub-layout, wherein the first and second desired layout feature patterns are separated by a first width and the spacer has a second width;
forming a third desired layout feature pattern over the target layer according to a third sub-layout, the third desired layout feature pattern shaped in part by the spacer, wherein forming a third desired layout feature pattern over the target layer according to a third sub-layout comprises:
depositing an intermediate layer over the target layer, the spacer, and the first and second desired layout feature patterns;
forming a trench in the intermediate layer to expose a portion of the target layer and a portion of the spacer; and
forming a plug within at least a portion of the trench;
etching the spacer from around the first and second desired layout feature pattern; and
after etching the spacer, etching the target layer using the first, second, and third layout feature patterns as masking features to form corresponding first, second, and third layout features in the target layer.

9. The method of claim 8, wherein forming a trench in the intermediate layer comprises exposing a portion of the intermediate layer to an activation energy.

10. The method of claim 9, further comprising removing the exposed portion of the intermediate layer.

11. The method of claim 9, wherein the activation energy is provided in photolithography process or an electron beam direct write process.

12. The method of claim 8, wherein forming a plug within at least a portion of the trench comprises:
depositing a plug material layer over the semiconductor substrate, the plug material layer covering the intermediate layer and filling the trench;
removing the plug material layer from over the intermediate layer; and
removing the plug material layer from over the portion of the spacer.

13. The method of claim 12, wherein removing the plug material layer comprises performing an etch back process.

14. The method of claim 8, wherein the intermediate layer includes a photoresist material.

15. A method for transferring a desired layout into a target layer on a semiconductor substrate, the method comprising:
receiving a decomposed desired layout, the decomposed desired layout comprises a first sub-layout, a second sub-layout, and a third sub-layout of the desired layout;
defining a first material layer with the first sub-layout to form a first feature pattern;
forming a first spacer around the first feature pattern;
defining a second material layer with the second sub-layout to form a second feature pattern, the first and second feature patterns being separated by at least a width of the first spacer;
forming a second spacer around the first and second feature patterns;
defining a third material layer with the third sub-layout to form a third feature pattern, the third feature pattern being separated from the first and second feature patterns by at a width of the second spacer, wherein defining the third material layer with the third sub-layout to form a third feature pattern comprises:
forming a trench within the third material layer;
filling the trench with a plug material layer; and
removing portions of the plug material layer that are not in contact with the target layer to form a plug; and
patterning the target layer using the first, second, and third feature patterns.

16. The method of claim 15, further comprising:
forming a third spacer around the first, second, and third feature patterns;
defining a fourth material layer with a fourth sub-layout to form a fourth feature pattern;
the fourth feature pattern being separated by the first, second, and third feature patterns by a width of a third spacer; and
patterning the target layer using the fourth feature pattern.

17. The method of claim 16, wherein defining the fourth material layer with fourth sub-layout to form the fourth feature pattern comprises:
forming a trench within the fourth material layer;
filling the trench with a plug material layer;
removing portions of the plug material layer that are not in contact with the target layer to form a plug; and
removing the fourth material layer.

18. The method of claim 16, wherein the fourth material layer comprises a photoresist layer.

19. A method comprising:
providing a substrate having a top surface and a bottom surface;
providing a target material layer over the substrate; and
forming a desired layout over and in contact with the target material layer,
wherein the desired layout comprises a first desired layout feature pattern, a second desired layout feature pattern, and a third desired layout feature pattern, each feature pattern being formed from a different sub-layout of the desired layout, and
wherein the third desired layout feature pattern is separated from the first and second desired layout feature patterns by a minimum spacing,
wherein the first desired layout feature pattern is formed from a first material that is different from a second material from which the second and third desired layout feature patterns are formed.

20. The method of claim 19, wherein the target material layer includes material only between the substrate and the desired layout.

* * * * *